(12) United States Patent
Lee

(10) Patent No.: US 8,318,558 B2
(45) Date of Patent: Nov. 27, 2012

(54) SEMICONDUCTOR DEVICE AND METHOD FOR FORMING THE SAME

(75) Inventor: Seung Hwan Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 120 days.

(21) Appl. No.: 12/827,845

(22) Filed: Jun. 30, 2010

(65) Prior Publication Data

US 2011/0291182 A1    Dec. 1, 2011

(30) Foreign Application Priority Data

May 27, 2010    (KR) .......................... 10-2010-0049651

(51) Int. Cl.
*H01L 21/8238*    (2006.01)

(52) U.S. Cl. ........ 438/212; 438/259; 438/268; 438/270; 438/524; 438/589; 257/329; 257/330; 257/E21.41; 257/E29.262

(58) Field of Classification Search .................. 438/212, 438/259, 268, 270, 524, 589; 257/329, 330, 257/E21.41, E29.262
See application file for complete search history.

(56) References Cited

U.S. PATENT DOCUMENTS

2011/0129975 A1*    6/2011    Lee .............................. 438/270

FOREIGN PATENT DOCUMENTS

KR    1020090099409 A    9/2009

\* cited by examiner

*Primary Examiner* — Andy Huynh

(57) ABSTRACT

A semiconductor device and a method for forming the same are disclosed. The semiconductor device includes vertical pillars formed by etching a semiconductor substrate and junction regions which are located among the neighboring vertical pillars and spaced apart from one another in a zigzag pattern. As a result, the semiconductor device easily guarantees an electrical passage between the semiconductor substrate and the vertical pillars, such that it substantially prevents the floating phenomenon from being generated, resulting in the prevention of deterioration of the semiconductor device.

16 Claims, 17 Drawing Sheets

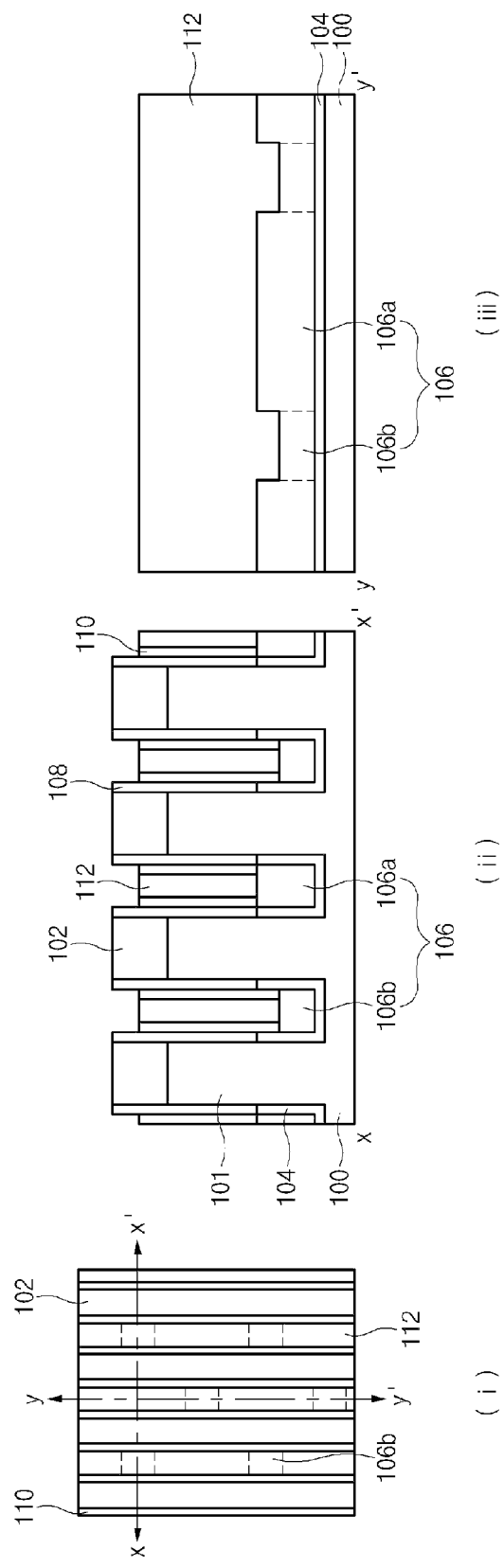

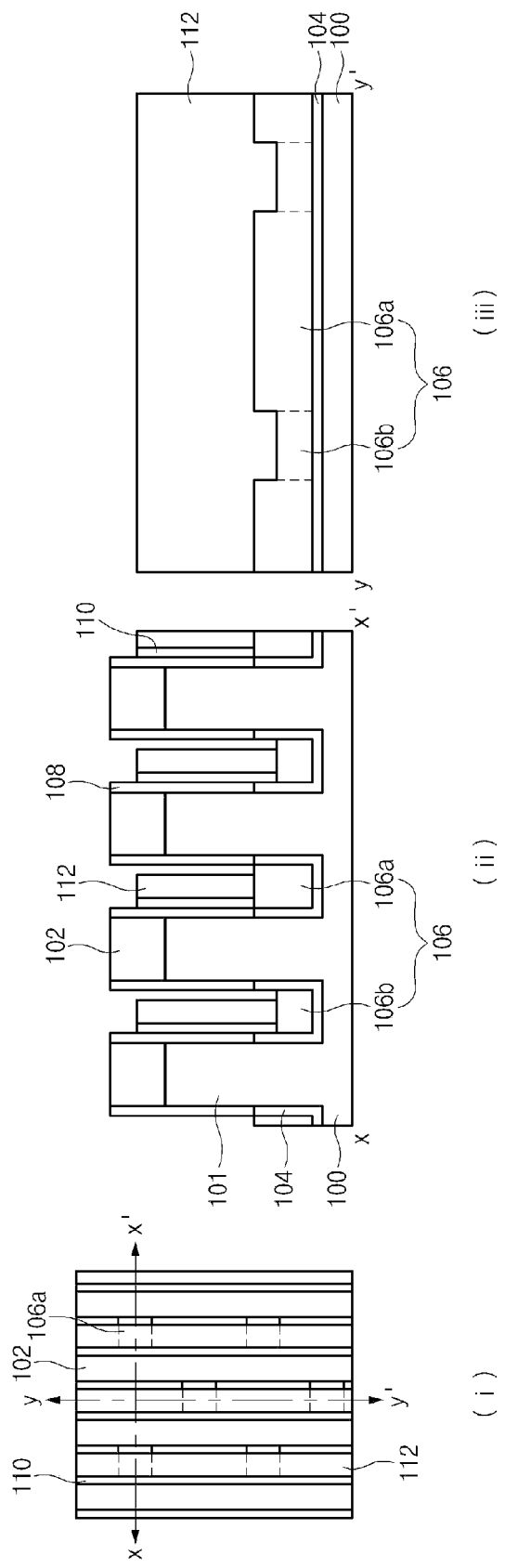

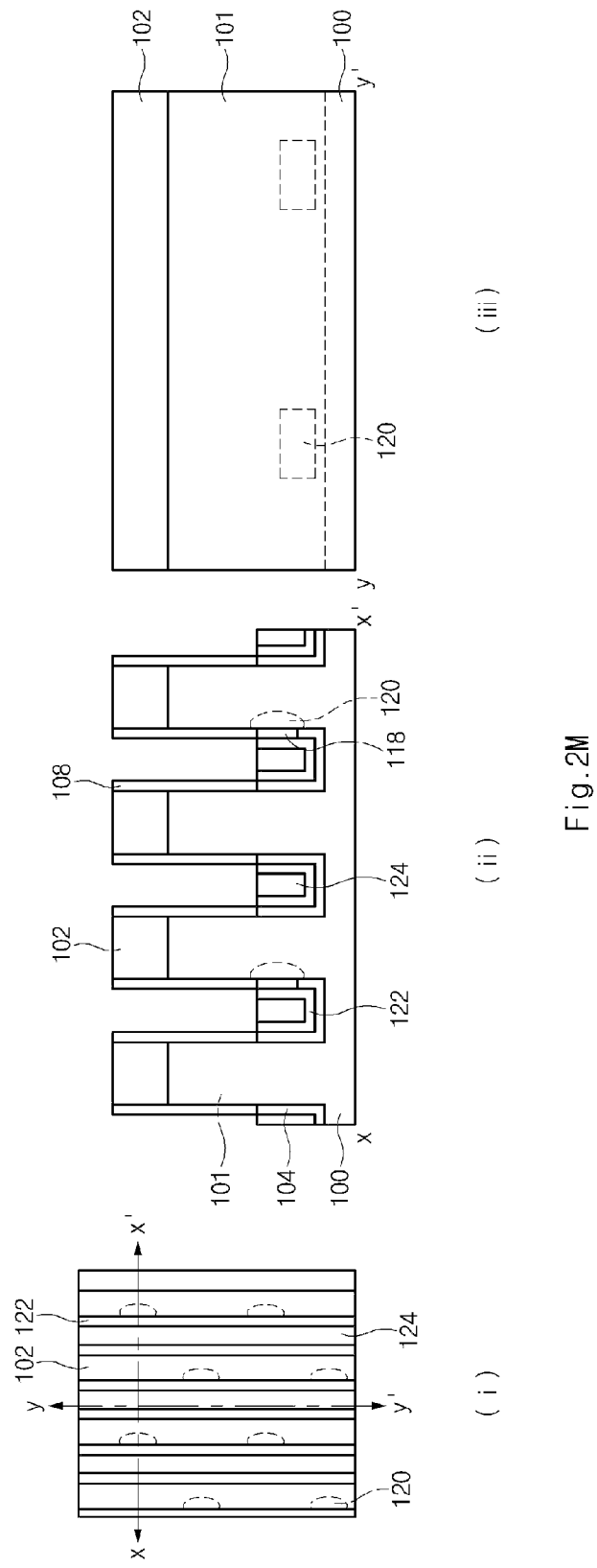

SEMICONDUCTOR DEVICE AND METHOD FOR FORMING THE SAME

CROSS-REFERENCE TO RELATED APPLICATION

The priority of Korean patent application No. 10-2010-0049651 filed on May 27, 2010, the disclosure of which is hereby incorporated in its entirety by reference, is claimed.

BACKGROUND OF THE INVENTION

Embodiments of the present invention relate to a semiconductor device, and more particularly to a semiconductor device for substantially preventing a floating body from being generated, and a method for forming the same.

In recent times, the demand of memory devices of 40 nm or less has been rapidly increased to improve the integration degree. It is very difficult for a planar or recessed gate transistor for use in an 8F2 (F: minimum feature size) or 6F2 format to be scaled down to 40 nm or less. Therefore, the demand of a Dynamic Random Access Memory (DRAM) having a 4F2 cell structure which is capable of increasing the integration degree by 1.5~2 times at the same scaling level has been rapidly increased. This increased demand has led to a vertical channel transistor to be newly proposed and developed.

The vertical channel transistor forms a surround-type gate electrode for enclosing the circumference of an active pillar vertically elongated on a semiconductor substrate, and forms a source region and a drain region at an upper part and a lower part of the pillar using the gate electrode as a reference, such that a channel is vertically formed. Accordingly, although the region of the vertical channel transistor is reduced, the effective channel length of the vertical channel transistor is not affected.

The vertical channel MOS transistor forms a gate electrode in the vicinity of the active pillar which is vertically elongated from a main surface of the semiconductor substrate, forms source/drain regions at upper and lower parts of the active pillar using the gate electrode as a reference point, such that a channel is formed perpendicular to the main surface of the semiconductor substrate. Therefore, although the area of the MOS transistor is reduced, the effective channel length of the vertical channel MOS transistor is not reduced. In order to implement the above-mentioned vertical channel semiconductor device, a new technology for forming a bit line which is buried in a device isolation region of a cell has recently been proposed.

The buried bit line according to the related art is formed by etching a semiconductor substrate by applying a self-alignment etching condition to a vertical pillar of the vertical channel semiconductor device and forming an insulation layer in the vicinity of the vertical pillar. The buried bit line formed by the above-mentioned method is in contact with a bit line contact formed by diffusion on one sidewall of the vertical pillar. The bit line contact is diffused as a line type on one sidewall of the vertical pillar, such that it causes a floating body phenomenon.

That is, because of the line-diffused bit line contact on one sidewall of the vertical pillar, a body voltage applied to a semiconductor substrate is not applied even to a channel part of the vertical transistor, such that a body portion for storing electric charges of the vertical transistor is floating. In more detail, an electric passage between the vertical transistor and the semiconductor substrate is blocked, such that it is difficult for a body bias to be applied to a channel of the vertical transistor. As a result, electric charges accumulate in the body of the vertical transistor and do not leak into the semiconductor substrate, such that the floating body effect is unavoidably encountered.

BRIEF SUMMARY OF THE INVENTION

Various embodiments of the present invention are directed to providing a semiconductor device and a method for forming the same that substantially obviate one or more problems due to limitations and disadvantages of the related art.

An object of the present invention is to provide a semiconductor device having a buried bit line structure and a method for forming the same, which can substantially prevent characteristics of the semiconductor device from being deteriorated when a floating body phenomenon is encountered by a bit line contact diffused in a vertical pillar.

In accordance with one aspect of the present invention, a semiconductor device includes a plurality of vertical pillars extending upward from a surface of a semiconductor substrate; first and second bit lines located proximate a lower portion of the plurality of vertical pillars neighboring in a first direction and extending along a second direction perpendicular to the first direction; a first junction region formed in the semiconductor substrate and in contact with a first side of the first bit line, and a second junction region formed in the semiconductor substrate and being in contact with a first side of the second bit line, the second junction region being diagonally spaced apart from the first junction region; and a plurality of gates formed over the plurality of vertical pillars neighboring in a second direction and extending along the first direction.

The first junction region and the second junction region each may be arranged in an island type.

The first junction region and the second junction region may be located at the bottom among the vertical pillars neighboring in the second direction.

The first bit line or the second bit line may include: a bit line metal layer; and a barrier metal layer located at a sidewall and bottom of the bit line metal layer.

The gate may be located on a side wall of the vertical pillar.

The semiconductor device may further include: a pad insulation layer to be buried among the vertical pillars and extended along the second direction.

In accordance with another aspect of the present invention, a method for forming a semiconductor device includes forming silicon line patterns extending along a second direction by etching a semiconductor substrate; forming a first bit line and a second bit line between the silicon line patterns; forming a first junction region formed in the semiconductor substrate and being in contact with a first side of the first bit line, and forming a second junction region formed in the semiconductor substrate, being in contact with a first side of the second bit line and being diagonally spaced apart from the first junction region; forming a vertical pillar by etching the silicon line patterns in a first direction perpendicular to the second direction; and forming a gate over the vertical pillars neighboring in the second direction and extending along the first direction.

The first junction region and the second junction region may be located at the bottom among the vertical pillars neighboring in the second direction.

The forming of the silicon line patterns may include: forming a hard mask pattern at an upper part of the semiconductor substrate; and etching the semiconductor substrate using the hard mask pattern as an etch mask.

The method may further include forming a liner oxide layer at a lower portion of the silicon line patterns; and forming a nitride layer enclosing a sidewall of an upper part of the silicon line patterns at an upper part of the liner oxide layer.

The method may further include, forming a buried polysilicon layer buried among the silicon line patterns; forming a photoresist pattern including zigzag-spaced hole patterns at upper parts of each silicon line pattern and the buried polysilicon layer; and etching back the buried polysilicon layer using the photoresist pattern as an etch mask.

The forming of the first junction region and the second junction region may include: exposing one sidewall of a lower part of the silicon line patterns; forming a polysilicon layer to cover the silicon line patterns; and diffusing the polysilicon layer at a specific part where the polysilicon layer is in contact with one sidewall of a lower part of the silicon line patterns.

The exposing of one sidewall of the lower part of the silicon line patterns may include: forming a metal spacer at sidewalls of the silicon line patterns; forming a buried insulation layer to be buried among the silicon line patterns; forming a polysilicon mask pattern at an upper part of the silicon line patterns; removing the metal spacer located at one sidewall of the silicon line patterns using the polysilicon mask pattern as a mask; removing the polysilicon mask pattern; and removing the buried insulation layer.

The forming of the polysilicon mask pattern may include: forming a liner polysilicon layer at an upper part of the silicon line patterns; performing ion implantation in the liner polysilicon layer; and removing the liner polysilicon layer where the ion implantation is not performed.

The performing of the ion implantation may include: performing ion implantation at 15° and 30° on a basis of a surface of the silicon line pattern.

The removing of the liner polysilicon layer where the ion implantation is not performed may be carried out by a wet etching method.

The removing of the metal spacer may be carried out by a wet etching method.

The removing of the polysilicon mask pattern may be carried out by a dry etching method.

The removing of the buried insulation layer may include removing a portion of the liner oxide layer.

The forming of the first bit line and the second bit line may include: forming a barrier metal layer between the silicon line patterns; and burying a space between the silicon line patterns, and forming a bit line metal layer at an upper part of the barrier metal layer.

The forming of the vertical pillar by etching the silicon line patterns in the first direction may include: etching the silicon line patterns to form a trench without exposing the first and second junction regions.

The method may further include, forming a pad insulation layer to be buried in the vertical pillars neighboring in the second direction.

It is to be understood that both the foregoing general description and the following detailed description of the present invention are exemplary and explanatory and are intended to provide further explanation of the invention as claimed.

BRIEF DESCRIPTION OF THE DRAWINGS

FIGS. 1(i) to 1(iii) illustrate a semiconductor device according to an embodiment of the present invention. FIG. 1(i) is a plan view illustrating the semiconductor device according to an embodiment of the present invention. FIG. 1(ii) is a cross-sectional view illustrating the semiconductor device taken along the line x-x' of FIG. 1(i). FIG. 1(iii) is a cross-sectional view illustrating the semiconductor device taken along the line y-y' of FIG. 1(i).

FIGS. 2A(i) to 2P(i) respectively illustrate plan views of the semiconductor devices shown in FIGS. 2A to 2P. FIGS. 2A(ii) to 2P(ii) respectively illustrate cross-sectional views of the semiconductor devices taken along the lines x-x' of FIGS. 2A(i) to 2P(i). FIGS. 2A(iii) to 2P(iii) respectively illustrate cross-sectional views of the semiconductor devices taken along the lines y-y' of FIGS. 2A(i) to 2P(i).

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
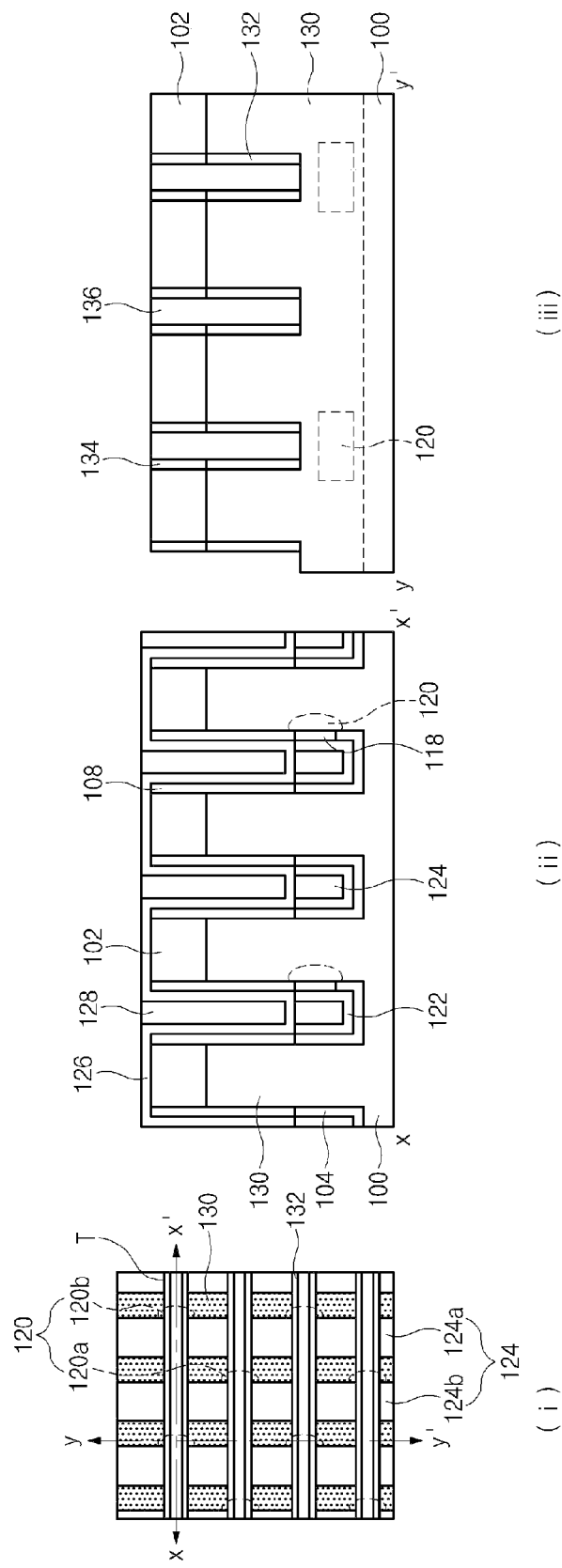

FIGS. 1(i) to 1(iii) illustrate a semiconductor device according to an embodiment of the present invention. FIG. 1(i) is a plan view illustrating the semiconductor device according to an embodiment of the present invention. FIG. 1(ii) is a cross-sectional view illustrating the semiconductor device taken along the line x-x' of FIG. 1(i). FIG. 1(iii) is a cross-sectional view illustrating the semiconductor device taken along the line y-y' of FIG. 1(i).

Referring to FIG. 1, the semiconductor device according to the present invention includes a plurality of vertical pillars 130 protruding from a semiconductor substrate 100; first and second bit lines 124a and 124b located at the bottom among the plurality of vertical pillars 130 neighboring in a first direction (x-x'); a first junction region 120a diffused in the semiconductor substrate 100 contacting one side of the first bit line 124a; a second junction region 120b which is diffused in the semiconductor substrate 100 contacting one side of the second bit line 124b, and is diagonally spaced apart from the first junction region 120a; and a gate 132 contained in the plurality of vertical pillars 130 neighboring in a second direction (y-y') perpendicular to the first direction (x-x').

In this case, each of the first junction region 120a and the second junction region 120b is configured in the form of an island, and it is preferable that the first and second junction regions 120a and 120b be located at the bottom among the plurality of vertical pillars 130 neighboring in the second direction (y-y'). Preferably, the first bit line 124a or the second bit line 124b may include a bit line metal layer and a barrier metal layer located at a sidewall and bottom of the bit line metal layer. Preferably, the gate 130 may be contained in one side and the other side of the vertical pillar. Preferably, the gates 130 may further include a pad insulation layer 136 buried among the vertical pillars 130 neighboring in the second direction (y-y').

The semiconductor device according to the present embodiment includes an island-type junction region, such that it easily prevents the floating body effect encountered in the conventional vertical channel semiconductor device from being generated, which prevents the deterioration of the semiconductor device.

Figure 2A:
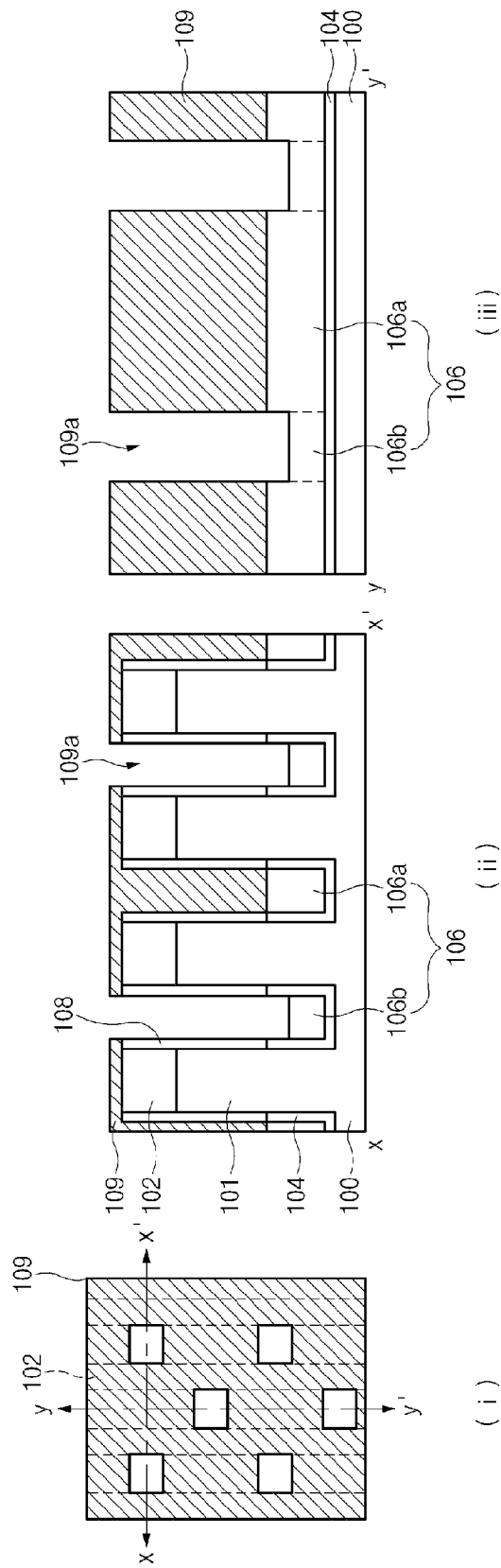
FIGS. 2A to 2P illustrate a method for forming a semiconductor device according to an embodiment of the present invention.
Figure 2B:
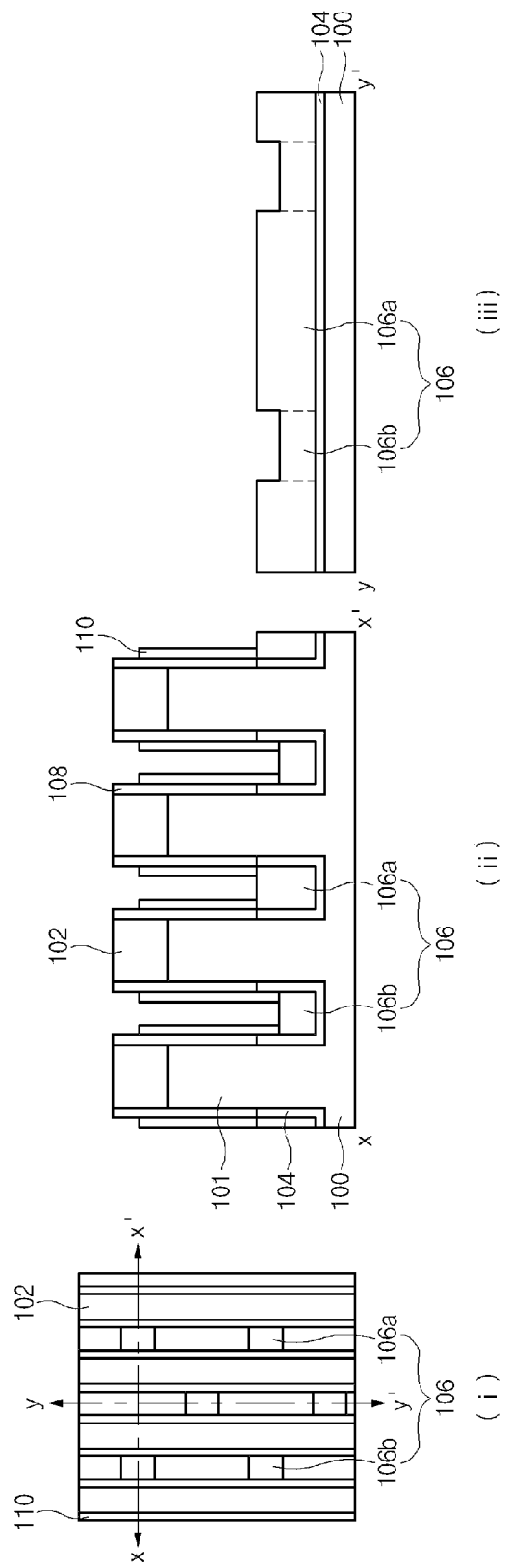
Figure 2D:
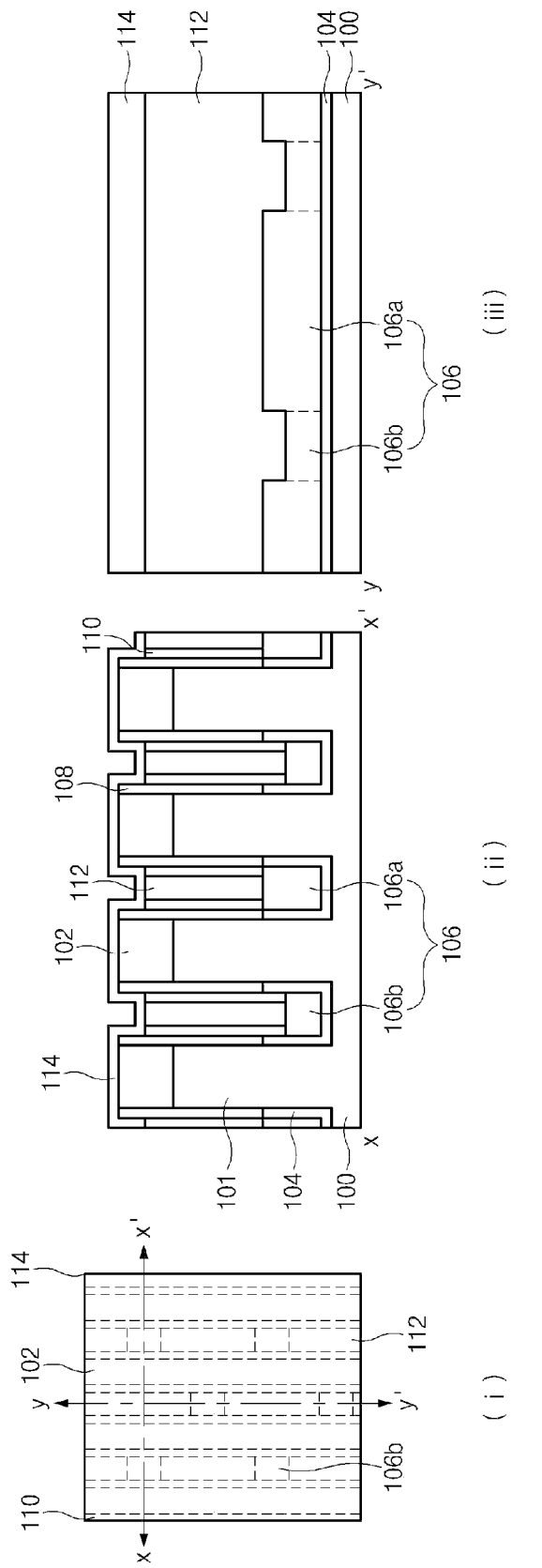
Figure 2E:
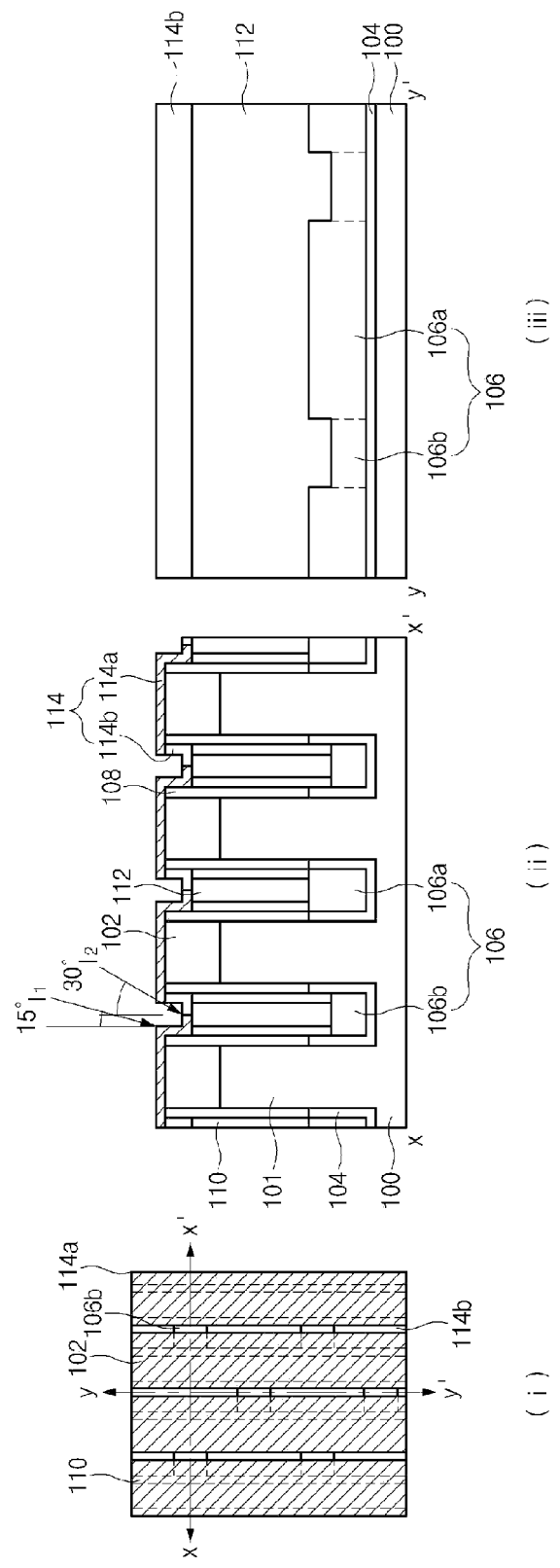
Figure 2F:
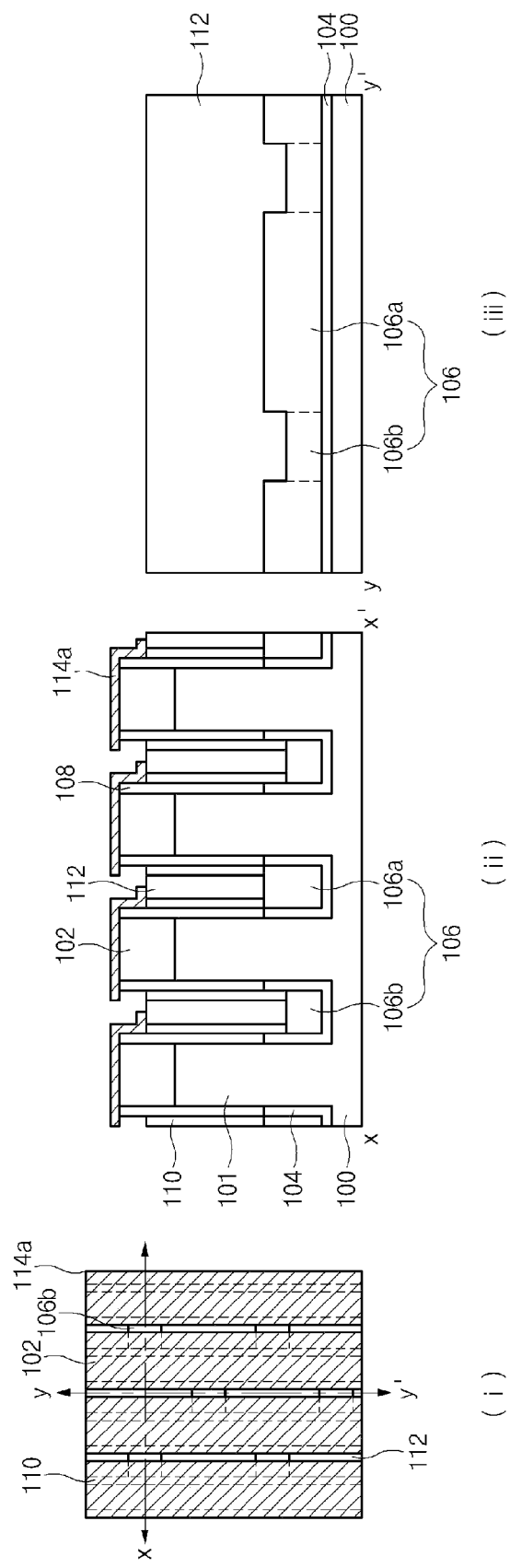
Figure 2G:
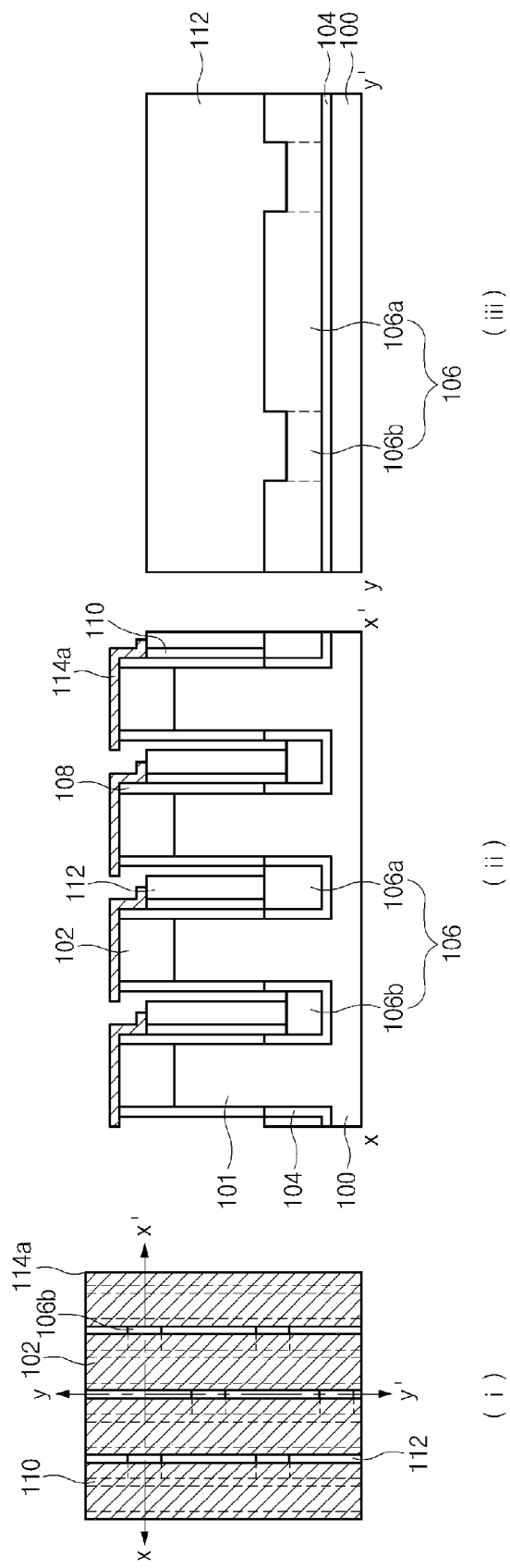
Figure 2I:
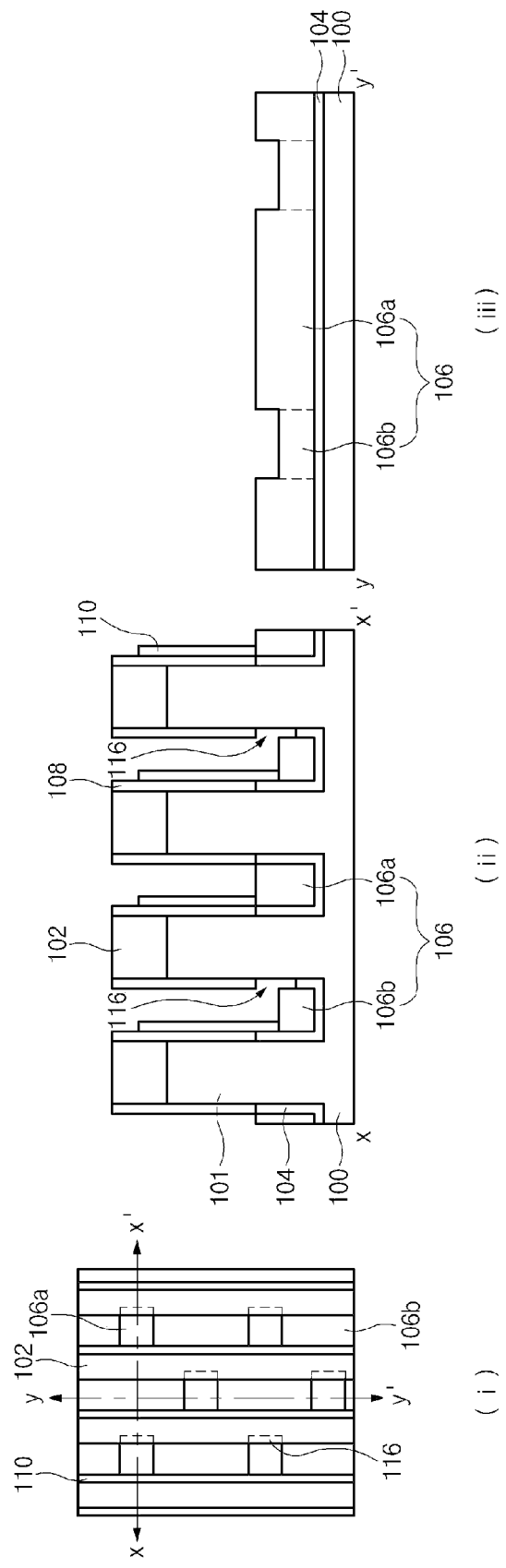
Figure 2J:
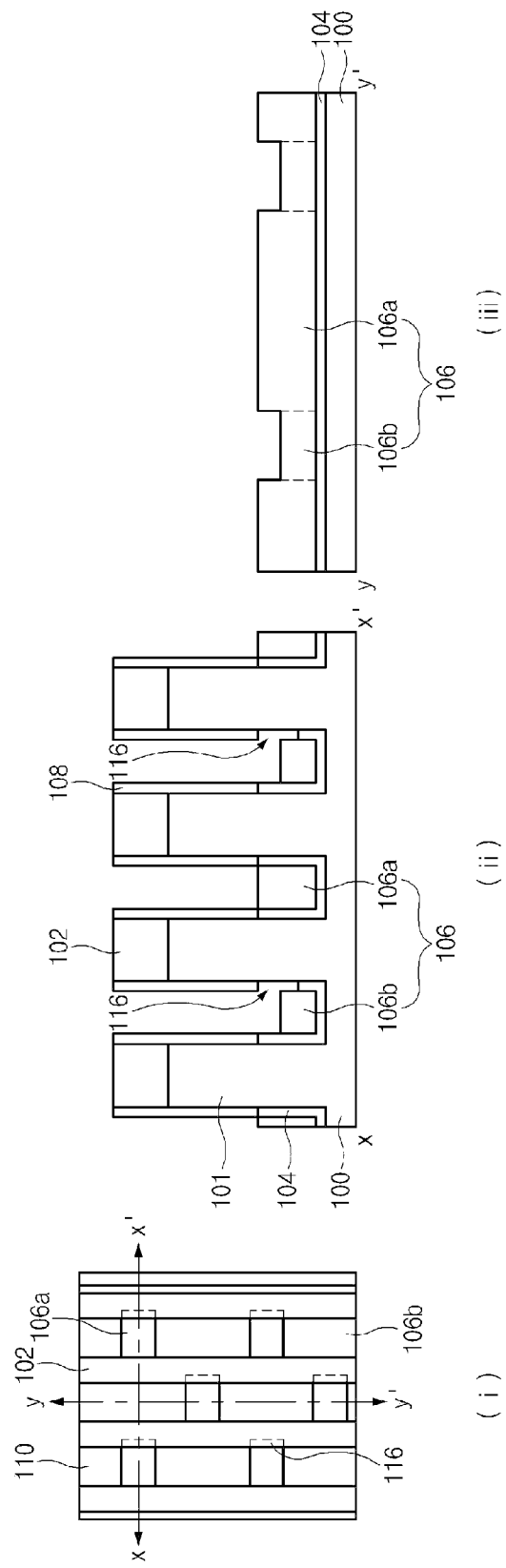
Figure 2K:
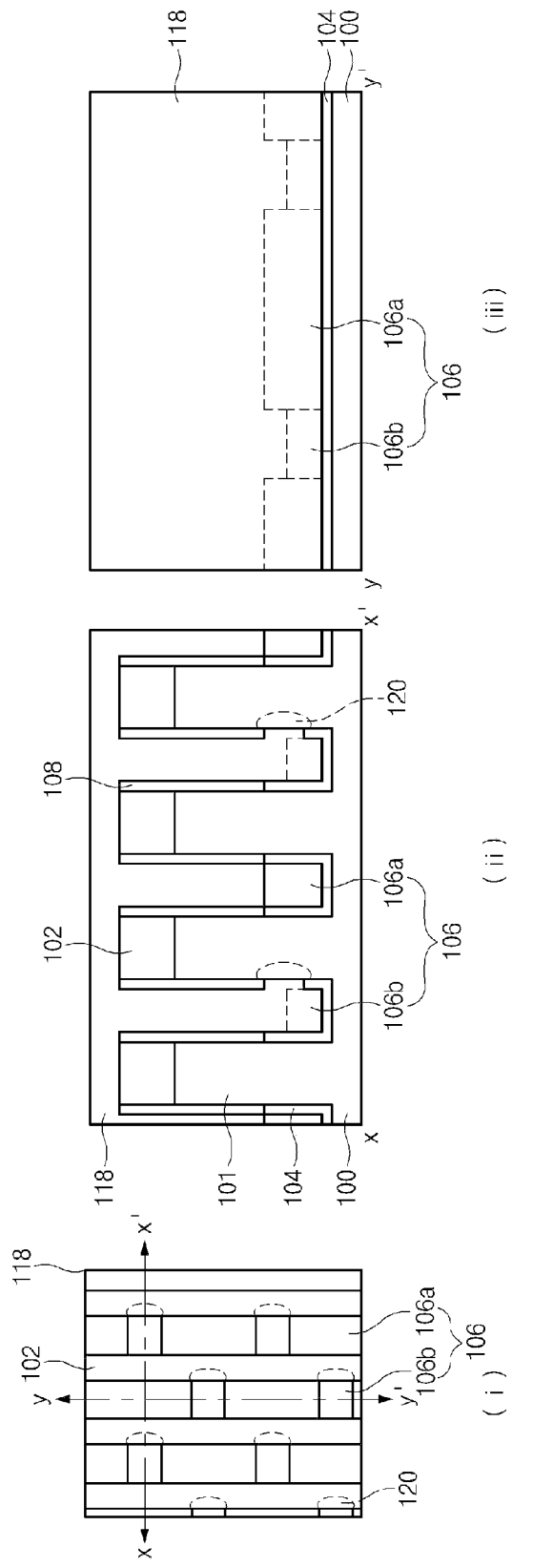
Figure 2L:
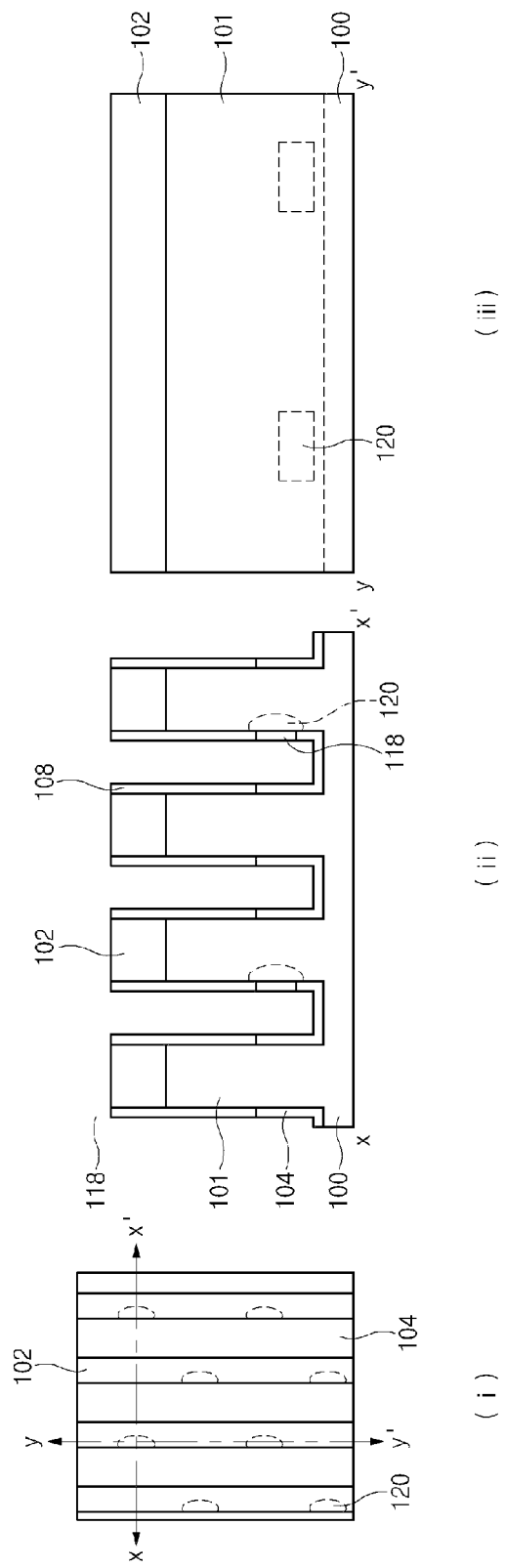
Figure 2N:
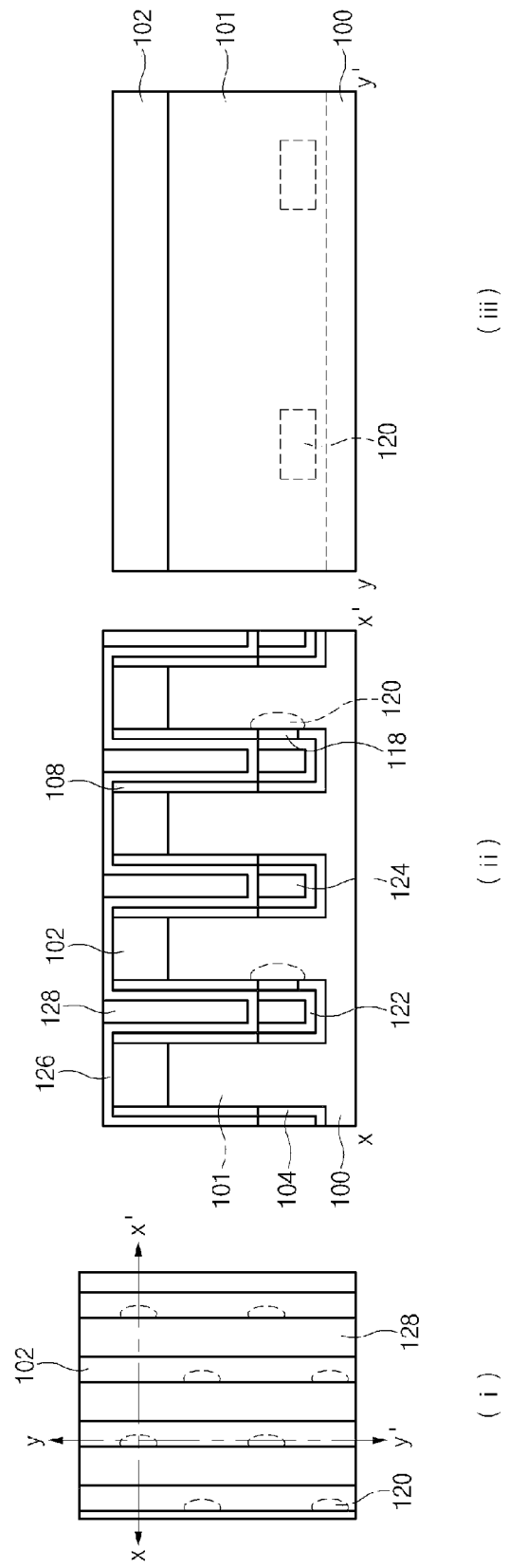
Figure 20:
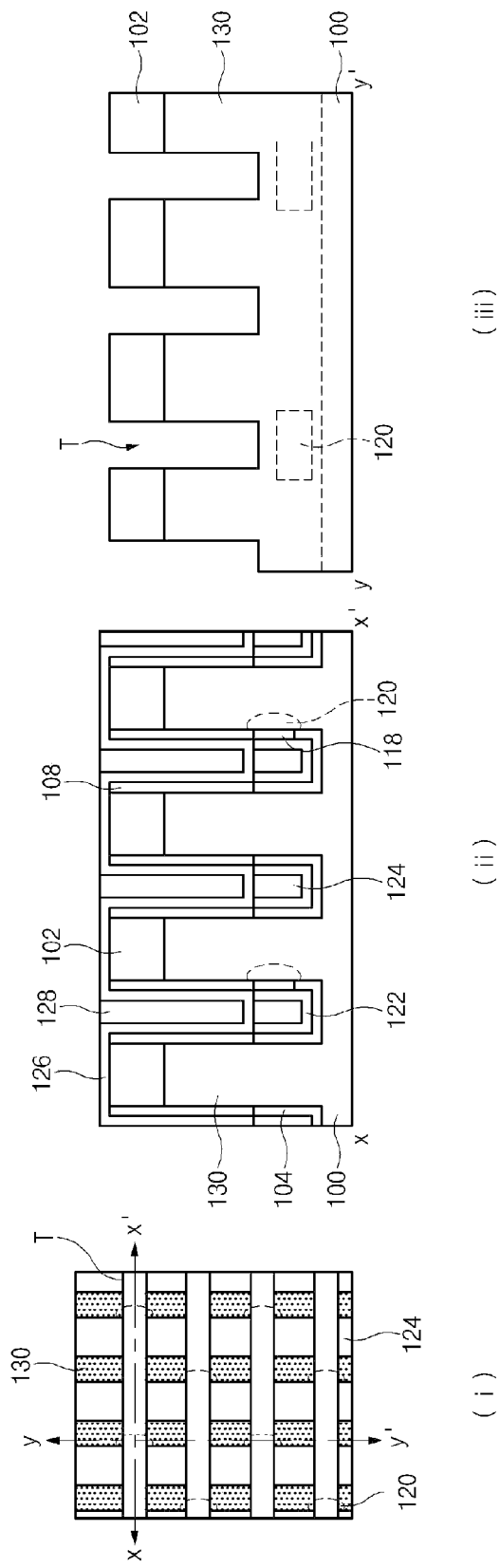
Figure 2P:
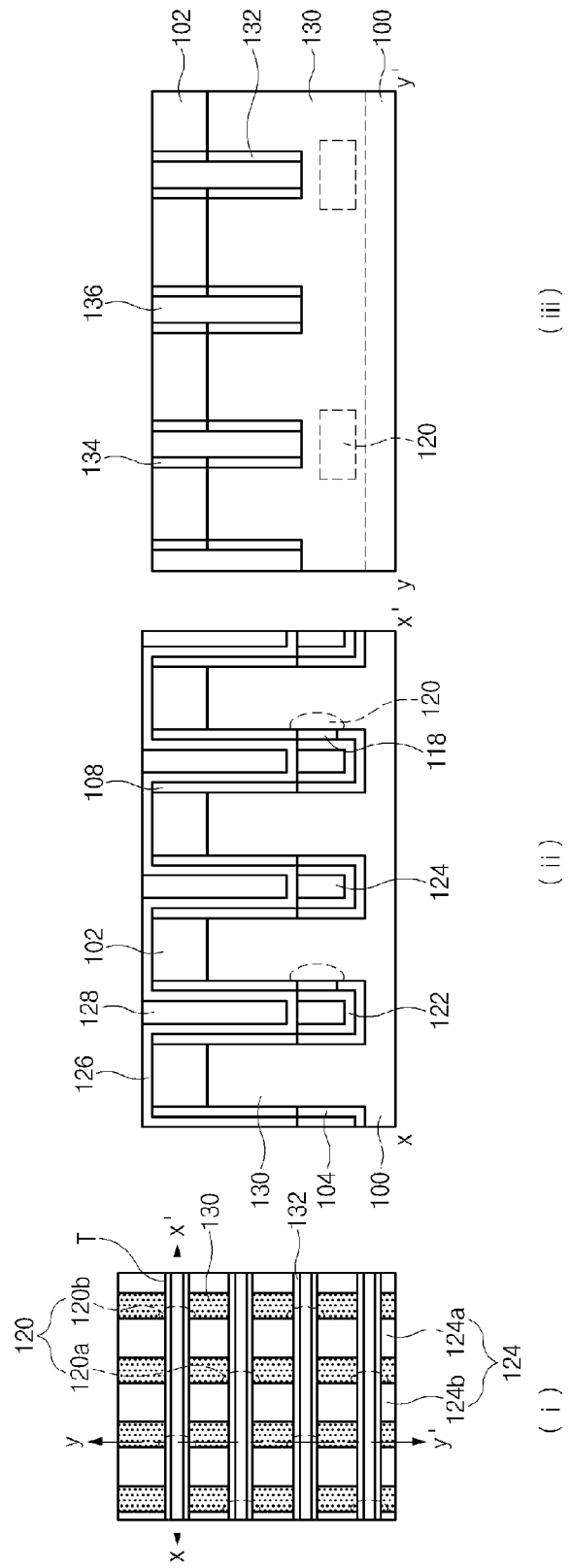

FIGS. 2A to 2P illustrate a method for forming a semiconductor device according to an embodiment of the present invention. FIGS. 2A(i) to 2P(i) respectively illustrate plan views of the semiconductor devices shown in FIGS. 2A to 2P. FIGS. 2A(ii) to 2P(ii) respectively illustrate cross-sectional views of the semiconductor devices taken along the lines x-x' of FIGS. 2A(i) to 2P(i). FIGS. 2A(iii) to 2P(iii) respectively illustrate cross-sectional views of the semiconductor devices taken along the lines y-y' of FIGS. 2A(i) to 2P(i).

Referring to FIG. 2A, a hard mask pattern 102 is formed over the semiconductor substrate 100, and a silicon line pattern 101 is formed by etching the semiconductor substrate 100 using the hard mask pattern 102 as an etch mask. A liner oxide layer 104 is formed at an upper part of the semiconductor substrate where the silicon line pattern 101 is formed, a buried polysilicon layer 106 buried in the bottom among the silicon line patterns 101, and the liner oxide layer 104 is etched to have the same height as that of the buried polysilicon layer 106. A liner nitride layer 108 may then be formed over the liner oxide layer 104, and may be etched back so that the etched back result is formed only at a sidewall of the silicon line pattern 101.

Subsequently, a photoresist pattern 109 including hole patterns 109a spaced apart from one another in the zigzag pattern is formed at an upper part of the semiconductor substrate 100, and the buried polysilicon layer 106 is etched back by a predetermined thickness using the photoresist pattern 109 as an etch mask. In this case, since the buried polysilicon layer 106 is etched back, junction regions can be spaced apart from one another in the zigzag pattern in a subsequent process, such that the zigzag-patterned junction regions can be easily formed at a sidewall of the silicon line pattern 101. For convenience of description and better understanding of the present invention, a polysilicon layer etched back by a predetermined thickness is referred to as an etch-back polysilicon layer 106b, and a non-etch-back polysilicon layer is referred to as a normal polysilicon layer 106a.

Referring to FIG. 2B, a metal layer is formed at upper parts of a normal polysilicon layer 106a and an etch-back polysilicon 106b. A spacer etching is performed in the metal layer, such that a metal spacer 110 is formed only at a sidewall of the silicon line pattern 101. Assuming that the metal layer formed over the hard mask 102 is excessively etched when the spacer is etched, even the metal layer located at a sidewall of the liner nitride layer 108 is etched, such that an upper part of the sidewall of the liner nitride layer 108 may be exposed. In this case, the metal spacer 110 may serve as a mask for defining a junction region in a subsequent process.

Referring to FIG. 2C, a buried insulation layer 112 is formed to be buried among the silicon line patterns 101, and the buried insulation layer 112 is etched back to expose an upper part of the metal spacer 110. Preferably, the buried insulation layer 112 may be an oxide layer.

Referring to FIG. 2D, a mask layer, for example, a liner polysilicon layer 114 is deposited over the hard mask pattern 102, the liner nitride layer 108, the metal spacer 110, and the buried insulation layer 112. The liner polysilicon layer 114 is formed with a step difference. The liner polysilicon layer 114 is subject to an incident implantation in a subsequent process to form a mask with an ion-rich sidewall, an ion-rich top surface and an ion-deficient sidewall.

Referring to FIG. 2E, the ion implantation process is performed over the liner polysilicon layer 114. Preferably, the ion implantation may be carried out at an angle of 15° ($I_1$) and 30° ($I_2$) with respect to the surface of the silicon line pattern 101. The reason why the ion implementation is performed at 15° and 30° is to allow the ion implantation to be evenly performed not only in one liner polysilicon layer 114 formed at the sidewall of the liner nitride layer 108 located at one sidewall of the silicon line pattern 101, but also in the other liner polysilicon layer 114 formed over the buried insulation layer 112. As a result, a first liner polysilicon layer 114 formed over a first sidewall of the silicon line pattern 101 and the other polysilicon layer 114 formed over the buried insulation layer 112 are not ion-implanted. Preferably, ions implanted by an ion-implantation process may be BF2.

As can be seen from FIG. 2E, for convenience of description and better understanding of the present invention, the ion-rich polysilicon layer (hereinafter referred to as an ion-rich mask pattern 114a) and the ion-deficient polysilicon layer 114b (hereinafter referred to as an ion-deficient mask pattern 114b) are represented by different reference numerals.

Referring to FIG. 2F, the ion-deficient mask pattern 114b is removed. Preferably, the ion-deficient mask pattern 114b may be wet-etched. For example, it is preferable that the ion-deficient mask pattern 114b be wet-etched by a mixed solution of a hydrofluoric acid (HF) and a phosphoric acid.

Referring to FIGS. 2G and 2H, a metal spacer 110 is removed using the ion-rich mask pattern 114a as a mask. In this case, it is preferable that the metal spacer 110 be wet-etched (See FIG. 2G). After that, the ion-rich mask pattern 114a is removed (See FIG. 2L). In this case, it is preferable that the ion-rich mask pattern 114a be dry-etched.

Referring to FIGS. 2I and 2J, the buried insulation layer 112 is removed (See FIG. 2I). Because the buried insulation layer 112 is an oxide layer, it is preferable that the liner oxide layer 104 exposed by removing the metal spacer 110 from the structure of FIG. 2H be partially removed simultaneously with the buried insulation layer 112. In more detail, it is preferable that the liner oxide layer 104 formed at a sidewall of the etch-back polysilicon layer 106b be removed. In this case, the liner oxide layer 104 located at a sidewall of the normal polysilicon layer 106a is not removed even though the metal spacer 110 is removed, such that the liner oxide layer 104 is not removed. In this case, for convenience of description and better understanding of the present invention, the part where the liner oxide layer 104 is removed defines a junction open region 116. The junction open regions 116 are spaced apart from one another in a zigzag pattern as an island type on the plan view, such that the other sidewall of the silicon line pattern 101 is exposed. After that, the metal spacer 110 is removed as shown in FIG. 2J.

Referring to FIG. 2K, a polysilicon layer 118 is formed to be buried among the silicon line patterns 101. The polysilicon layer 118 is diffused in the silicon line pattern 101 through the junction open region 116, such that the junction region 120 is formed.

Referring to FIGS. 2L to 2M, the polysilicon layer 118 buried among the silicon line patterns 101 is removed to form the junction region 120 (See FIG. 2L). Subsequently, a barrier metal layer 122 is formed at a surface of the bottom between the silicon line patterns 101 over the junction region 120, and a bit line metal layer 124 is formed to be buried in the bottom between the silicon line patterns 101 over the barrier metal layer 122. After that, the bit line metal layer 124 and the barrier metal layer 122 are etched back such that each of the bit line metal layer 124 and the barrier metal layer 122 may have the same height as that of the liner oxide layer 104.

Referring to FIG. 2N, the liner insulation layer 126 may be formed over the silicon line pattern 101, the barrier metal layer 122 and the bit line metal layer 124. Then, the interlayer insulation layer 128 is formed to be buried between the silicon line patterns 101. Preferably, the liner insulation layer 126 may include a nitride layer.

Referring to FIG. 2O, a photoresist pattern (not shown) for forming a trench T defining a gate region is formed over the silicon line pattern 101 including the interlayer insulation layer 128. The hard mask pattern 102 and the silicon line pattern 101 are etched using the photoresist pattern as an etch mask, such that the vertical pillar 130 is formed. In this case, it is preferable that the trench T is located at a higher level than the junction region 120 and is formed by etching the silicon line pattern 101 in such a manner that the junction region 120 is not exposed. In other words, the vertical pillar 130 is formed when the silicon line pattern 101 is divided by the trench T located at a higher level than the junction region 120. Therefore, the junction region 120 is located among the vertical pillars 130 neighboring in the second direction (y-y'). In this case, it is preferable that the first direction (x-x') is perpendicular to a longitudinal direction of the bit line metal layer 124.

Referring to FIG. 2P, a vertical gate 132 and a spacer 134 are formed at sidewalls of the vertical pillars 130 neighboring in the second direction (y-y'), and a pad insulation layer 136 is formed to be buried between the vertical pillars 130 neighboring in the second direction (y-y').

As described above, in the semiconductor device including a vertical gate, the junction regions are formed among the neighboring vertical pillars, and are spaced apart from one another in a zigzag pattern. Thus, the floating body phenomenon is prevented from being generated in the vertical gate, resulting in the improvement of the semiconductor device characteristics.

As apparent from the above description, an embodiment of the present invention forms junction regions which are spaced apart from one another in a zigzag pattern, and guarantees an electrical passage between a semiconductor substrate and a vertical pillar, such that it substantially prevents the floating phenomenon from being generated, which prevents the deterioration of the semiconductor device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
    forming first, second, and third silicon line patterns by etching a semiconductor substrate, wherein the first, second, and third silicon line patterns are arranged along a first direction, wherein each of the first, second, and third silicon line patterns extend along a second direction;
    forming a first bit line and a second bit line between the first and the second silicon line patterns and between the second and the third silicon line patterns, wherein the first and the second bit lines each extend along the second direction;
    forming a first junction region in a first sidewall of the second silicon line pattern to be in contact with a first side of the first bit line, and forming a second junction region in a first sidewall of the third silicon line pattern to be in contact with a first side of the second bit line, wherein the first and the second junction regions are arranged along a third direction extending diagonally between the first and the second directions;
    forming first, second, and third vertical pillars by etching upper portions of the first, the second, and the third silicon line patterns along the first direction; and
    forming a gate coupled to the first, the second, and the third vertical pillars and extending along the first direction,
    wherein the first and the second junction regions are formed in island types.

2. The method according to claim 1, wherein the first junction region and the second junction region are located at bottom portions of the second and the third vertical pillars, respectively.

3. The method according to claim 1, wherein the forming of the first, the second, and the third silicon line patterns includes:
    forming a hard mask pattern at an upper part of the semiconductor substrate; and
    etching the semiconductor substrate using the hard mask pattern as an etch mask.

4. The method according to claim 3, the method further comprising:
    forming liner oxide layers over lower portions of the first sidewalls and second sidewalls of the second and the third silicon line patterns; and
    forming a nitride layer over upper portions of the first and the second sidewalls of the second and the third silicon line patterns.

5. The method according to claim 1, wherein the forming of the first bit line and the second bit line includes:
    forming barrier metal layers over trenches between each of the first, the second, and the third silicon line patterns; and
    filling the trenches with conductive material to form bit line metal layers,
    wherein the bit line metal layers are formed over the barrier metal layers.

6. The method according to claim 1, wherein the forming of the first, the second, and the third vertical pillars by etching the upper portions of the first, the second, and the third silicon line patterns includes:
    etching the first, the second, and the third silicon line patterns to form trenches without exposing the first and second junction regions.

7. The method according to claim 6, the method further comprising:
    forming pad insulation layers filling the trenches.

8. A method for forming a semiconductor device comprising:
    forming silicon line patterns by etching a semiconductor substrate along a second direction;
    forming a first bit line and a second bit line between the silicon line patterns;
    forming a first junction region formed in the semiconductor substrate and being in contact with a first side of the first bit line, and forming a second junction region formed in the semiconductor substrate, being in contact with a first side of the second bit line and being diagonally spaced apart from the first junction region;
    forming a vertical pillar by etching the silicon line patterns in a first direction perpendicular to the second direction; and
    forming a gate over the vertical pillars neighboring in the second direction and extending along the first direction,
    wherein the first junction region and the second junction region are located at the bottom among the vertical pillars neighboring in the second direction,
    wherein the forming of the silicon line patterns includes:
        forming a hard mask pattern at an upper part of the semiconductor substrate; and etching the semiconductor substrate using the hard mask pattern as an etch mask, and wherein the method further includes: forming a liner oxide layer at a lower portion of the silicon line patterns; and forming a nitride layer enclosing a sidewall of an upper part of the silicon line patterns at an upper part of the liner oxide layer, wherein the method further includes: forming a buried polysilicon layer to be buried among the silicon line patterns; forming a photoresist pattern including zigzag-spaced hole patterns at upper parts of each silicon line pattern; and etching back the buried polysilicon layer using the photoresist pattern as an etch mask.

9. The method according to claim 8, wherein the forming of the first junction region and the second junction region includes:

exposing one sidewall of a lower part of the silicon line patterns;

forming a polysilicon layer to cover the silicon line patterns; and diffusing the polysilicon layer at a specific part where the polysilicon layer is in contact with the one sidewall of the lower part of the silicon line patterns.

10. The method according to claim 9, wherein the exposing of one sidewall of the lower part of the silicon line patterns includes:

forming a metal spacer at sidewalls of the silicon line patterns;

forming a buried insulation layer to be buried among the silicon line patterns;

forming a polysilicon mask pattern at an upper part of the silicon line patterns;

removing the metal spacer located at one sidewall of the silicon line patterns using the polysilicon mask pattern as a mask;

removing the polysilicon mask pattern; and removing the buried insulation layer.

11. The method according to claim 10, wherein the forming of the polysilicon mask pattern includes:

forming a liner polysilicon layer at an upper part of the silicon line patterns;

performing ion implantation on a portion of the liner polysilicon layer; and removing the liner polysilicon layer where the ion implantation is not performed.

12. The method according to claim 11, wherein the performing of the ion implantation includes:

performing ion implantation at 15° and 30° with respect to a surface of the silicon line pattern.

13. The method according to claim 11, wherein the removing of the liner polysilicon layer where the ion implantation is not performed is carried out by using a wet etching method.

14. The method according to claim 10, wherein the removing of the metal spacer is carried out by using a wet etching method.

15. The method according to claim 10, wherein the removing of the polysilicon mask pattern is carried out by using a dry etching method.

16. The method according to claim 10, wherein the removing of the buried insulation layer includes removing a portion of the liner oxide layer.

* * * * *